United States Patent [19]

Dagostino et al.

[11] Patent Number: 4,510,571
[45] Date of Patent: Apr. 9, 1985

[54] WAVEFORM STORAGE AND DISPLAY SYSTEM

[75] Inventors: Thomas P. Dagostino, Beaverton; John D. Trudel, Tigard, both of Oreg.

[73] Assignee: Tektronix, Inc., Beaverton, Oreg.

[21] Appl. No.: 309,651

[22] Filed: Oct. 8, 1981

[51] Int. Cl.³ .......................... G06F 3/14; G06F 7/02; G11C 15/00
[52] U.S. Cl. .................................. 364/487; 315/383; 340/723; 364/769
[58] Field of Search ............... 364/487, 769, 728, 417; 324/121 R; 340/715, 722, 709, 723; 315/377, 383, 386, 384, 385; 128/702, 712

[56] References Cited

U.S. PATENT DOCUMENTS

| | | | |
|---|---|---|---|
| 3,215,136 | 11/1965 | Holter et al. | 128/712 |
| 3,517,175 | 6/1970 | Williams | 364/728 |
| 3,579,252 | 5/1971 | Goodman | 340/715 |
| 3,638,066 | 1/1972 | Paine et al. | 315/383 |
| 4,107,651 | 8/1978 | Martin | 315/383 |
| 4,124,894 | 11/1978 | Vick et al. | 364/417 |
| 4,132,928 | 1/1979 | Berlin | 315/377 |
| 4,250,888 | 2/1981 | Grosskopf | 128/702 |
| 4,316,249 | 2/1982 | Gallant et al. | 364/487 |
| 4,340,065 | 7/1982 | Gessman | 128/712 |
| 4,352,105 | 9/1982 | Harney | 340/715 |
| 4,386,614 | 6/1983 | Ryan | 128/777 |

*Primary Examiner*—Felix D. Gruber
*Attorney, Agent, or Firm*—George T. Noe

[57] ABSTRACT

A waveform storage and display system particularly useful in digital oscilloscopes is provided in which successive waveforms of a repetitive signal are compared with a reference waveform, and upon detection of a difference or change within the waveform, the changed waveform is automatically stored. In addition to the conventional acquisition and display waveform memories, a reference-waveform and a changed-waveform memories are provided. Once a reference waveform is selected and stored, comparison of subsequent successive waveforms to detect changes is achieved under microprocessor control. Several display modes to provide a visual indication of changes may be implemented.

8 Claims, 4 Drawing Figures

WAVEFORM STORAGE AND DISPLAY SYSTEM

BACKGROUND OF THE INVENTION

This invention relates generally to the storage and display of waveforms by a digital oscilloscope, and in particular to a digital system for detecting and storing waveforms which differ from a stored reference waveform.

Conventional digital oscilloscopes record and display time-varying electrical phenomena by converting analog signals to digital representations which are then stored as a complete waveform to be subsequently regenerated for display on a cathode-ray tube screen. Typically, digital oscilloscopes operate in independent acquisition (or store) and display modes, having separate waveform memories for each mode, permitting the use of independent and perhaps different clocking rates. Because of the limited memory space available for waveform storage and the amount of elapsed time between waveform acquisition and subsequent display, various operating modes have been developed for user convenience.

One such operating mode is the multiple waveform storage system described in U.S. Pat. No. 4,198,683 to Thomas P. Dagostino and assigned to the assignee of the present invention. Here, several waveforms are acquired in seriatum and stored in separate respective waveform memories and then displayed in chronological sequence by a history controller and memory counter. When a new waveform is acquired, the oldest waveform is discarded.

Another operating mode is the waveform storage system described in U.S. Pat. No. 4,271,486 to Thomas P. Dagostino and Luis J. Navarro and assigned to the assignee of the present invention. In this mode, maximum signal deviations along a waveform are detected and stored at predetermined intervals so that a composite envelope of the signal may be displayed.

Often it is desired to monitor repetitive electrical signals for occasional changes or random occurrences, such as glitches, missing pulses, and so forth, and to store such changed phenomena for display, perhaps in comparison with a reference waveform. However, such monitoring can be very tedious to a user.

SUMMARY OF THE INVENTION

In accordance with the present invention, a waveform storage and display system is provided in which successive waveforms of a repetitive signal are compared with a reference waveform, and upon detection of a difference or change within the waveform, the changed waveform is stored.

In the preferred embodiment of the present invention, a digital oscilloscope having independent acquisition and display waveform memories interconnected by a microprocessor bus is provided with two additional waveform memories—one for storing a reference waveform and the other for storing a changed waveform. The comparison is achieved under microprocessor control, and several display modes may be provided.

It is therefore one object of the present invention to provide a novel waveform storage and display system for a digital oscilloscope.

It is another object of the present invention to provide a waveform storage and display system in which successive waveforms of a repetitive signal are compared with a reference waveform, and upon detection of a difference or change within the waveform, the changed waveform is stored.

It is a further object of the present invention to provide a waveform storage and display system for a digital oscilloscope in which a waveform which differs from a reference waveform is stored automatically upon its occurrence, and the changed waveform or portions thereof may be displayed.

Other objects and advantages of the present invention will become apparent to those having ordinary skill in the art upon a reading of the following description when taken in conjunction with the accompanying drawings.

DRAWINGS

FIG. 1 is a block diagram of a digital oscilloscope embodying the waveform storage and display system of the present invention; and FIGS. 2A-2C are waveforms for explaining one aspect of the present invention.

DETAILED DESCRIPTION OF THE INVENTION

Figure 1:
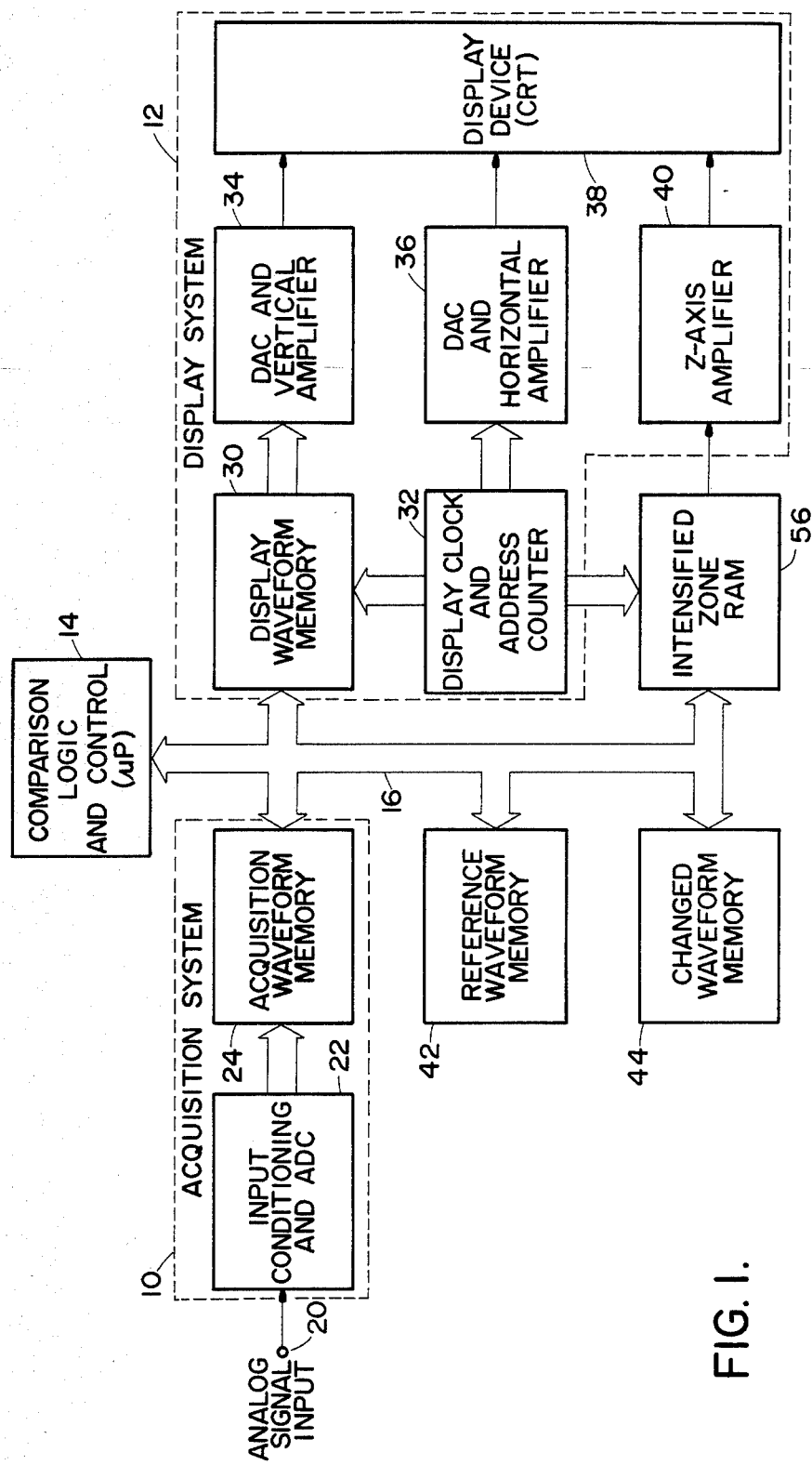

Referring to the block diagram of FIG. 1, an acquisition system 10 and a display system 12 are generally interconnected by a microprocessor system including a comparison logic and control unit 14 and its associated bus 16, forming a digital oscilloscope. Analog signals are applied via an input terminal 20 to an input conditioning circuit and analog-to-digital converter (ADC) 22. These are conventional circuits and typically include input buffering, attenuation, preamplification, and triggering to condition the signal to suitable levels and frame starting point for conversion to n-bit parallel digital data by the ADC. The ADC suitably may be of the type that is sample-clocked or strobed to provide the digital data at a predetermined conversion rate. The digital data is stored in an acquisition memory 24 under the control of an address counter (not shown) which operates in synchronism with the sample clock that drives the ADC. The acquisition memory 24 typically has capacity to store one waveform, or one screen-width frame of information.

The display system 12 includes a display waveform memory 30, a display clock and address counter 32, a digital-to-analog converter (DAC) and vertical amplifier system 34, a DAC and horizontal amplifier system 36, and a display device 38. The named blocks contain conventional circuits commonly used in digital oscilloscope display systems. The display waveform memory is loaded with data representing a waveform by the microprocessor 14 via the bus 16. The stored display data is clocked out of memory 30 under control of the display clock and address counter 32, converted to analog signals and displayed on the vertical axis of the display device. Likewise, the address data produced by the address counter portion of block 32 are converted to analog values to drive the display along the horizontal axis of the display device 38. The display device 38 for this particular system is a cathode-ray tube, although other graphic display media, such as flat-panel display devices, may be used. A Z-axis amplifier 40 is also provided to turn the CRT display beam on and off in accordance with the waveform information to be displayed.

Two additional waveform memories are provided on the bus 16—a reference waveform memory 42 and a changed-waveform memory 44. Upon command manually asserted by an operator or in accordance with programmed instructions, the comparison logic and control unit 14 transfers the contents of the acquisition memory 24 to the reference waveform memory 42 thereby to store a reference waveform. Thereafter, new waveforms may be acquired by the acquisition system 10, perhaps on a repetitive basis at predetermined time intervals in the conventional manner. All of the successive waveforms are triggered or initiated in the same manner and therefore are expected to be substantially identical to the reference waveform. The comparison logic and control unit 14 compares each newly acquired waveform stored in the acquisition memory 24 with the reference waveform in memory 44. The comparison logic may be implemented in hardware using digital comparators, latches, and gate circuits, or the comparison logic may be implemented in software. Both techniques are well known in the art. When any deviation from the reference waveform is detected in a newly-acquired waveform, that waveform containing the deviation automatically is stored in the changed waveform memory 44 by the microprocessor portion of comparison logic and control unit 14. The detected deviation may be in the form of a glitch, missing pulse, ringing aberrations, transients, or any other change in the waveform, even a complete change or the loss of the waveform.

Several display modes are possible because the contents of memories 24, 42, and 44 are equally accessible and may be transferred to the display waveform memory 30. One such display mode contemplated is to display both the reference and changed waveforms, alternating between the two in a manner similar to the conventional alternate mode associated with analog oscilloscopes. In this mode, the reference waveform is displayed by itself on the display device 38 until the changed waveform is detected, at which time the alternate mode begins. Appropriate level-shifting DC voltage may be added to either or both waveforms at the vertical amplifier stage to cause vertical displacement on the viewing screens, separating the waveforms for easy visual comparison. The fact that two waveforms are so displayed indicates that a change has occurred and has been stored, so that it is not necessary that the user monitor the display watching for the change, or even be present when the change occurs.

Figure 2A:
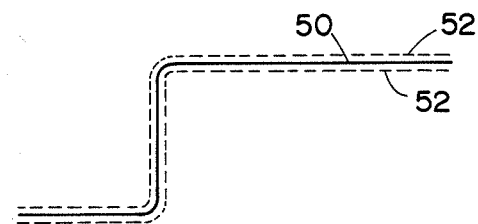
Figure 2B:
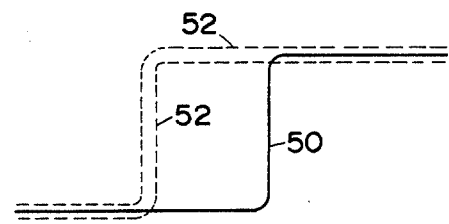
Figure 2C:
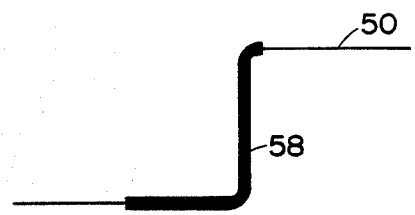

Another display mode contemplated is to display the changed waveform with the changed portion intensified. In FIG. 2A, a reference waveform 50 is shown using the leading edge of a pulse as an example. The microprocessor portion of comparison logic and control unit 14 may generate a guard band, shown by the dashed lines 52, substantially coincident with the reference waveform to establish the limits of permissible deviation. The guard band may be programmed to accommodate any desired or anticipated characteristic. In FIG. 2B, the waveform 50 is shown shifted to the right. The comparison logic portion of unit 14 detects a change in waveform because a portion of the waveform is outside the guard band. Not only is the changed waveform stored in memory 44, but the addresses of the deviant waveform portion are stored in an intensified zone random-access memory (RAM) 56, shown connected between bus 16 and Z-axis amplifier 40 in FIG. 1. The changed waveform is transferred to display waveform memory 30, and is then clocked out for display by the display clock and address counter 32. When the address counter reaches the addresses stored in RAM 56, logic signals are generated and applied to the Z-axis amplifier 40, which in turn increases the bias current of the cathode-ray tube 38, intensifying the changed part of the waveform. The intensified zone is shown by the heavy line 58 in FIG. 12C.

In addition to the waveform display modes discussed above, the microprocessor portion of comparison logic and control unit 14 may be programmed to perform any of several well-known analysis techniques, such as signature analysis, on the waveforms to detect change.

It will therefore be appreciated that the aforementioned and other desirable objects have been achieved; however, it should be noted that the particular embodiment of the invention which is shown and described herein is intended as merely illustrative and not as restrictive of the invention.

What we claim as our invention is:

1. A method of storing and displaying waveforms comprising the steps of:
   receiving electrical signals and converting said signals to digital representations thereof to provide acquired waveforms;
   storing a first acquired waveform as a reference in a reference waveform memory;
   storing subsequently-acquired waveforms in an acquisition memory;
   electronically comparing by comparison logic means said subsequently-acquired waveforms with said reference waveform and detecting a changed waveform with respect to said reference waveform; and
   storing said changed waveform in a third waveform memory automatically upon said detection, wherein any of said memories may be coupled to a display system to display the contents thereof.

2. A method in accordance with claim 1 further comprising the step of providing a visual indication that a change has occurred.

3. A method in accordance with claim 2 wherein said step of providing a visual indication comprises displaying said changed waveform with the portion thereof that differs from the reference waveform being intensified.

4. A waveform storage and display system, comprising: means for receiving electrical signals and converting said signals to digital representations thereof to provide acquired waveforms;
   a first waveform memory for storing a first acquired waveform as a reference waveform;
   a second waveform memory for storing subsequently-acquired waveforms;
   means for electronically comparing said subsequently-acquired waveforms with said reference waveform and detecting a changed waveform with respect to said reference waveform; and
   means for storing said changed waveform in a third waveform memory automatically upon said detection.

5. A system in accordance with claim 4 further comprising means for providing a visual indication that a change has occurred.

6. A system in accordance with claim 5 wherein said visual indication means comprises a display device capable of displaying the changed waveform in relation to the reference waveform.

7. A system in accordance with claim 4 wherein said comparison means includes means for establishing permissible deviation from said reference waveform.

8. A system in accordance with claim 4 further comprising means for storing information identifying locations along the changed waveform that differ from the reference waveform.

* * * * *